(12) United States Patent
Lucke et al.

(10) Patent No.: US 6,846,987 B2
(45) Date of Patent: Jan. 25, 2005

(54) POWER ELECTRONICS COMPONENT

(75) Inventors: Olaf Lucke, Frankfurt am Main (DE); Bernd Thyzel, Glashuetten (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/487,769

(22) PCT Filed: Aug. 29, 2002

(86) PCT No.: PCT/DE02/03177

§ 371 (c)(1),
(2), (4) Date: Feb. 25, 2004

(87) PCT Pub. No.: WO03/026008

PCT Pub. Date: Mar. 27, 2003

(65) Prior Publication Data

US 2004/0206534 A1 Oct. 21, 2004

(30) Foreign Application Priority Data

Aug. 31, 2001 (DE) .......................................... 101 42 614

(51) Int. Cl.$^7$ ................................................. H05K 7/20
(52) U.S. Cl. ...................... 174/52.1; 361/707; 361/714; 361/719
(58) Field of Search ............................... 174/52.1, 52.4; 361/688, 704, 707, 708, 709, 710, 711, 714, 715, 717–719, 722; 257/712, 717, 720

(56) References Cited

U.S. PATENT DOCUMENTS

| | | | |
|---|---|---|---|
| 4,591,537 A | | 5/1986 | Aldinger et al. |
| 5,159,532 A | | 10/1992 | Kilian et al. |
| 5,819,858 A | | 10/1998 | Nechansky |
| 5,981,085 A | * | 11/1999 | Ninomiya et al. ........... 428/614 |
| 6,103,397 A | | 8/2000 | Sugimoto et al. |
| 6,245,442 B1 | * | 6/2001 | Towata et al. ............... 428/614 |
| 6,310,775 B1 | * | 10/2001 | Nagatomo et al. ........... 361/707 |
| 2003/0148070 A1 | | 8/2003 | Goebel et al. |

FOREIGN PATENT DOCUMENTS

| | | |
|---|---|---|
| DE | 32 47 985 C3 | 7/1984 |
| DE | 36 43 288 C2 | 6/1988 |
| DE | 38 31 148 C1 | 3/1990 |
| DE | 38 37 975 A1 | 5/1990 |
| DE | G 89 14 493.7 | 6/1990 |
| DE | G 89 08 678.3 | 1/1991 |
| DE | 41 00 145 A1 | 7/1991 |
| DE | 43 30 975 A1 | 3/1995 |
| DE | 195 10 988 A1 | 10/1995 |
| DE | 297 14 730 U1 | 12/1997 |
| DE | 196 25 756 A1 | 1/1998 |
| DE | 198 10 544 A1 | 9/1998 |
| DE | 197 40 330 A1 | 3/1999 |
| DE | 198 07 718 A1 | 9/1999 |

* cited by examiner

Primary Examiner—Dean A. Reichard
Assistant Examiner—Carmelo Oliva
(74) Attorney, Agent, or Firm—Cohen, Pontani, Lieberman & Pavane

(57) ABSTRACT

The invention relates to a power electronics component that comprises a support element on which conductor tracks (5) are disposed for electrically connecting the electrical power components (7) that are also disposed on the support element and the control components of a circuit. The support element is linked with a thermoconducting housing part of a housing that accommodates the support element in a thermoconductive manner. The support element consists of a porous, ceramics component whose pores are filled with metal and which is covered by a thick-film dielectric on which the conductor tracks (5), in the form of thick-film conductor tracks, and the power components (7) are disposed, and the conductor tracks (5) arm connected to the electrical power components (7) in a electroconductive manner. The support element is disposed to rest against the housing component.

22 Claims, 1 Drawing Sheet

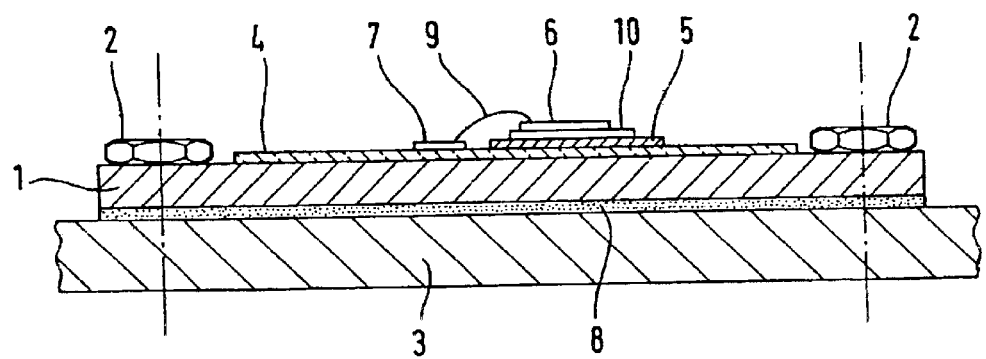

POWER ELECTRONICS COMPONENT

PRIORITY CLAIM

This is a U.S. national stage of application No. PCT/DE02/03177, filed on 29 Aug. 2002. Priority is claimed on that application and on the following application(s): Country: Germany, Application No.: 101 42 614.3, Filed: 31 Aug. 2001.

BACKGROUND OF THE INVENTION

1. Field of the Invention

The invention relates to a power electronics unit, in particular for a control device in a motor vehicle, with a support element on which conductor tracks are arranged for electrically connecting electrical power components and control components of a circuit that are likewise arranged on the support element, the support element being connected in a thermally conducting manner to a thermally conducting housing component of a housing accommodating the support element.

2. Description of the Prior Art

With power electronics units there is the problem that the electrical power components generate heat, which has to be removed. For this purpose, it is known to form the support element as an insulating printed circuit board, on which copper conductor tracks are provided, for example by lamination, and the electrical power components and any control components there may be are connected to the copper conductor tracks by soldering.

These printed circuit boards are adhesively bonded onto the housing components by means of thermally conductive adhesive, the housing component consequently serving as a heat spreader, and also dissipating heat to the surroundings.

In this case, it is disadvantageous that the heat resistance between the electrical power components and the housing component is relatively great and, in particular when there is a relatively great density of electrical power components on the printed circuit board, the heat removal is inadequate.

SUMMARY OF THE INVENTION

The object of the invention is therefore to provide a power electronics unit of the type stated at the beginning which, while being of a simple construction, has a low heat resistance between the electrical power components and the housing component in spite of electrical insulation of the electrical power components.

This object is achieved according to the invention by the support element comprising a porous, ceramic component, the pores of which are filled with metal or with metals and which is covered with a thick-film dielectric, on which the conductor tracks as thick-film conductor tracks and the power components are provided and the conductor tracks are connected to the electrical power components in an electrically conducting manner by soldering, the support element being arranged such that it rests against the housing component.

A metallic support element formed in such a way has the advantage that, by virtue of the very good thermal conductivity, it already serves as a heat spreader and distributes the heat generated by the electrical power components very directly onto a large surface area. At the same time, however, the low coefficient of expansion under the great temperature changes to which the power electronics unit is exposed, in particular in a motor vehicle, prevents the electrical power components from being torn off the conductor tracks. Good heat removal can then take place from the already large surface area of the support element to the housing component, consisting in the usual way of aluminum, and from there to the surroundings.

The electrical insulation takes place by means of the thick-film dielectric, which can be made very thin and only insignificantly influences the good heat transfer from the electrical power components to the support element, but ensures a secure connection of the thick-film conductor tracks provided on it on account of the expansion-adapted system of layers.

The good heat dissipation allows electrical power components that are smaller, and consequently less expensive and require less installation space, to be used.

Preferred forms of the support element are that the support element comprises a silicon carbide matrix, the pores of which are filled with aluminum, or that the support element comprises a sintered copper matrix, the pores of which are filled with molybdenum, or that the support element comprises a sintered copper matrix, the pores of which are filled with tungsten. These forms combine the advantages of good thermal conductivity with expansion coefficients that lie far below those of copper or aluminum and are approximately the same as those of the electrical power components.

If the support element is a support plate with a thickness of greater than 0.5 mm, in particular a thickness of between approximately 0.5 mm and 4.0 mm, then it is possible for the support element to be separately produced with the circuit and electrical power components as a finished product to be arranged in a simple manner on the housing component as a stable, break-resistant component.

The thick-film dielectric may be a glass layer, which can be printed onto the support element and bonded to the support element by a thermal process in a simple manner.

Another possibility is that the thick-film dielectric is a plasma layer, which is preferably an $Al_2O_3$ layer applied in a plasma spraying process. In this case, the thick-film dielectric may have a thickness of between approximately 5 $\mu$m and 40 $\mu$m and consequently leave the heat transfer uninfluenced to the greatest extent.

There is, however, also the possibility of firstly applying a plasma layer to the support element and applying the glass layer to the plasma layer, whereby the electrical insulation is particularly reliable and the plasma layer serves as an adhesion promoter for the glass layer.

To simplify the production process, the conductor tracks may be printed on a LTTC sheet (low temperature cofired ceramic) and in this form applied to the thick-film dielectric and bonded to the thick-film dielectric by a thermal process.

In this case, the LTTC sheet may have a thickness of approximately 0.1 mm. The complexity of the production process is reduced in particular if, after they have been applied to the support element, the thick-film dielectric and the LTTC sheet provided with the conductor tracks are exposed to temperature in a joint thermal process, since in this way the number of thermal processes can be reduced.

It helps to achieve secure connection of the electrical power components if the conductor tracks have terminal pads for connecting the electrical power components and/or the control components.

Once the support element has been arranged such that it is resting flat against the housing component, particularly good removal of the heat generated by the electrical power components is achieved.

An arrangement of the support element on the housing component that is both secure and can be simply carried out is achieved by the support element being arranged on the housing component by means of fastening elements, the support element being fastened on the housing component in a simple manner by means of screws, and this allowing the connection to be made as secure as desired.

In addition, a layer of thermally conductive paste may be arranged between the support element and the housing component. To achieve particularly good heat removal to the surroundings, the housing component may be an outer wall of the housing.

If the heat that is generated by the electrical power components and is to be removed is particularly great, the housing component may be a wall of the housing that can be subjected to a cooling agent.

BRIEF DESCRIPTION OF THE DRAWINGS

An exemplary embodiment of the invention is represented in the drawing and described in more detail below. The single FIGURE of the drawing shows a power electronics unit in cross section.

DETAILED DESCRIPTION OF THE PRESENTLY PREFERRED EMBODIMENTS

The power electronics unit represented has a support plate 1, which comprises a silicon carbide matrix, the pores of which are filled with aluminum (AlSiC). This support plate 1, which has a thickness of 1.5 mm, is fastened by screws 2 on an outer wall 3 of a housing made of aluminum such that the support plate 1 rests flat against the outer wall 3. A thin layer of thermally conductive paste 8 is arranged between the support plate 1 and the outer wall 3 of the housing.

On the side facing away from the outer wall 3, a thick-film dielectric comprising glass layer 4 ($Al_2O_2$) has been printed on the support plate 1. The thick-film dielectric alternatively comprise on $Al_2O_3$ layer.

On top of the glass layer 4 there has been applied an LTTC sheet, on which the pattern of conductor tracks 5 of a circuit were printed using the thick-film technique.

In a subsequent thermal process, the glass layer 4 and the conductor tracks 5 were securely connected to the support plate 1.

Along with the conductor track 5, an electrical power component 7 (power semiconductor element) has been provided on the glass layer 4. A terminal 9 of the power component 7 is connected to a terminal pad 10 of the conductor track 5 in an electrically conducting manner by soldering using soft solder 6.

What is claimed is:

1. A power electronics unit for a control device in a motor vehicle, comprising:
   a housing having a thermally conducting housing component;
   a support element accommodated by said housing and resting against said thermally conducting housing component such that said support element is connected to said thermally conducting housing component by a thermally conducting connection, the support element comprising a ceramic component defining pores, wherein said pores are filled with metal;
   a thick-film dielectric covering at least a portion of said support element; and
   a circuit arranged on said thick-film dielectric, said circuit comprising thick film conductor tracks, electrical power components, and control components, said conductor tracks electrically connecting said electrical power components and said control components, and said electrical power components being electrically connected to said conductor tracks by a soldered connection.

2. The power electronics unit of claim 1, wherein said support element includes a silicon carbide matrix and said pores are filled with aluminum.

3. The power electronics unit of claim 1, wherein said support element includes a sintered copper matrix and said pores are filled with molybdenum.

4. The power electronics unit of claim 1, wherein said support element includes a sintered copper matrix and said pores are filled with tungsten.

5. The power electronics unit of claim 1, wherein said support element comprises a support plate having a thickness of at least 0.5 mm.

6. The power electronics unit of claim 5, wherein the thickness of said support plate is within the range of approximately 0.5 mm to 4.0 mm.

7. The power electronics unit of claim 1, wherein said thick-film dielectric is a glass layer.

8. The power electronics unit of claim 7, wherein said glass layer is printed onto said support layer and bonded to said support layer by a thermal process.

9. The power electronics unit of claim 7, wherein said thick-film dielectric has a thickness within the range of approximately 5 $\mu$m and 40 $\mu$m.

10. The power electronics unit of claim 1, wherein said thick-film dielectric is a plasma layer.

11. The power electronics unit of claim 10, wherein said plasma layer is an $Al_2O_3$ layer applied by a plasma spraying process.

12. The power electronics unit of claim 10, wherein said thick-film dielectric has a thickness within the range of approximately 5 $\mu$m and 40 $\mu$m.

13. The power electronics unit of claim 1, wherein said conductor tracks comprise conductor tracks that are printed on a low temperature cofired ceramic sheet, wherein the conductor tracks and the low temperature cofired ceramic sheet are applied to the thick-film dielectric and bonded to the thick-filmed dielectric by a thermal process.

14. The power electronics unit of claim 13, wherein said low temperature cofired ceramic sheet has a thickness of approximately 0.1 mm.

15. The power electronics unit of claim 13, wherein the thick-film dielectric is bonded to the support element and the low temperature cofired ceramic sheet is bonded to the thick-film dielectric by a joint thermal process.

16. The power electronics unit of claim 1, wherein said conductor tracks comprise terminal pads for connection to the electrical power component and the control components.

17. The power electronics unit of claim 1, wherein said support element is arranged so that it rests flat against said thermally conducting housing component.

18. The power electronics unit of claim 1, further comprising fastening elements for holding the support element against said thermally conducting housing component.

19. The power electronics unit of claim 18, wherein said fastening elements comprise threaded fastening elements.

20. The power electronics unit of claim 1, further comprising a layer of thermally conductive paste arranged between said support element and said housing part.

21. The power electronics unit of claim 1, wherein said thermally conducting housing component is an outer wall of said housing.

22. The power electronics unit of claim 1, wherein said thermally is subjectable to a cooling agent.

* * * * *